US011267196B2

(12) United States Patent
Stadlmann

(10) Patent No.: US 11,267,196 B2
(45) Date of Patent: Mar. 8, 2022

(54) METHOD FOR PRODUCING A THREE-DIMENSIONAL OBJECT

(71) Applicant: Klaus Stadlmann, Vienna (AT)

(72) Inventor: Klaus Stadlmann, Vienna (AT)

(*) Notice: Subject to any disclaimer, the term of this patent is extended or adjusted under 35 U.S.C. 154(b) by 178 days.

(21) Appl. No.: 16/062,742

(22) PCT Filed: Dec. 9, 2016

(86) PCT No.: PCT/AT2016/060120
§ 371 (c)(1),
(2) Date: Jun. 18, 2018

(87) PCT Pub. No.: WO2017/100811
PCT Pub. Date: Jun. 22, 2017

(65) Prior Publication Data
US 2019/0315051 A1 Oct. 17, 2019

(30) Foreign Application Priority Data
Dec. 17, 2015 (AT) .............................. A 51079/2015

(51) Int. Cl.
*B29C 64/135* (2017.01)
*B29C 35/08* (2006.01)
(Continued)

(52) U.S. Cl.
CPC ........ *B29C 64/135* (2017.08); *B29C 35/0805* (2013.01); *G03F 7/0037* (2013.01); *B33Y 10/00* (2014.12); *B33Y 40/00* (2014.12)

(58) Field of Classification Search
None
See application file for complete search history.

(56) References Cited

U.S. PATENT DOCUMENTS 5,247,180 A * 9/1993 Mitcham ............... B29C 64/129
250/492.1
5,273,691 A * 12/1993 Hull ...................... B29C 64/135
264/401
(Continued)

FOREIGN PATENT DOCUMENTS

AT 514496 B1 4/2015
CN 204466799 U 7/2015
(Continued)

OTHER PUBLICATIONS

International Search Report and Written Opinion for PCT/AT2016/060120, dated Apr. 19, 2017 (14 pages).
(Continued)

*Primary Examiner* — Matthew J Daniels
*Assistant Examiner* — Paul Spiel
(74) *Attorney, Agent, or Firm* — Eversheds Sutherland (US) LLP

(57) ABSTRACT

In order to produce a three-dimensional object in a stereolithographic process a plurality of layers (30) are cured in a chronological sequence such that, as a whole, they form the three-dimensional object. The layers are divided into two or more sub-regions (31, 32) which lie substantially adjacent to one another within the layer, wherein one sub-region in an edge area (34) adjoining another sub-region of the same layer contains area parts (35) which protrude into the other sub-region in a form-fitting manner. These sub-regions are developed one after the other and thus together form the desired layer regions.

13 Claims, 5 Drawing Sheets

(51) Int. Cl.
*B33Y 10/00* (2015.01)
*G03F 7/00* (2006.01)
*B33Y 40/00* (2020.01)

(56) References Cited

U.S. PATENT DOCUMENTS

| | | | |
|---|---|---|---|
| 6,391,245 B1* | 5/2002 | Smith | B33Y 10/00 264/401 |
| 6,500,378 B1* | 12/2002 | Smith | B33Y 10/00 264/401 |
| 2003/0033128 A1 | 2/2003 | Nagano et al. | |
| 2008/0054531 A1 | 3/2008 | Kerekes et al. | |
| 2010/0283188 A1 | 11/2010 | Rohner et al. | |
| 2013/0075954 A1 | 3/2013 | Gregory, II et al. | |
| 2015/0210013 A1 | 7/2015 | Teulet | |
| 2016/0136902 A1 | 5/2016 | Stadlmann | |
| 2016/0200042 A1* | 7/2016 | Jeng | B33Y 50/00 264/401 |
| 2018/0056585 A1* | 3/2018 | Du Toit | B29C 64/129 |

FOREIGN PATENT DOCUMENTS

| | | |
|---|---|---|
| EP | 1666235 A1 | 6/2006 |
| EP | 1946910 A2 | 7/2008 |
| EP | 2067608 A1 | 6/2009 |
| EP | 2241430 A1 | 10/2010 |
| JP | S63-236627 A | 10/1988 |
| JP | H05-96631 A | 4/1993 |
| JP | H09-286058 A | 11/1997 |
| WO | 2014/016668 A1 | 1/2014 |
| WO | 2014/126834 A2 | 8/2014 |
| WO | 2014/199134 A1 | 12/2014 |
| WO | 2016/062739 A1 | 4/2016 |

OTHER PUBLICATIONS

International Search Report and Written Opinion for PCT/AT2016/060104, dated May 30, 2017 (17 pages).
Office Action issued in Austrian Application No. A 50966/2015, dated Aug. 1, 2016 (3 pages).
Office Action issued in Austrian Application No. A 51079/2015, dated Sep. 7, 2016 (2 pages).

* cited by examiner

METHOD FOR PRODUCING A THREE-DIMENSIONAL OBJECT

The invention relates to a 3D printing method, more precisely a method for producing a three-dimensional object in a stereolithographic process by developing a plurality of layers in a chronological sequence such that, as a whole, they form the three-dimensional object, wherein at least one of the layers is divided into two or more sub-regions, which lie substantially adjacent to one another; the sub-regions thus defined are developed in separate development steps. A layer or a sub-region of a layer is developed generally by curing a substance suitable for this purpose.

Methods of this kind are known, wherein, besides stereolithography, various other methods, such as rapid prototyping, photo solidification or 3D printing are also common. In a stereolithographic process a three-dimensional body is produced from a photosensitive substance by building up layers or layer information continuously or layer by layer. In a production process of this kind, a curable substance is used to produce a three-dimensional object ("body" or "object") layer by layer by producing geometric layer information, which for example can be produced by a digital mask or by a moving laser beam, said object having a predefinable desired shaping. The curable substance is generally a light-sensitive material, which is liquid or pasty and cures when irradiated by suitable light, usually a liquid monomer formulation.

Different 3D printing methods for producing three-dimensional objects from a photosensitive material are known. Depending on the method, pasty, liquid or also granular materials are solidified here by the action of electromagnetic radiation (for example by UV radiation, IR radiation). One example is that constituted by stereolithographic methods, which use pixel-based mask exposure methods to locally and selectively cure a photosensitive material. In these methods the original layer information can be converted into sub-information for sub-regions of the individual layers so as to then be cured in regions.

Exposure systems that use pixel-based mask exposure systems (for example Micro Optical Mirror Devices, or MEMS [microelectromechanical systems], which are also known under the trade name DLP) in order to generate layer information are limited to an exposure region of a certain size at a given resolution of the pixels. This is also true for other exposure methods, such as optical systems, such as Galvano scanners.

An approach known per se for getting around this limitation in respect of the sizes lies in the fact that layer information that is too large for the exposure region is divided into smaller sub-regions and is then exposed in the form of these sub-regions.

An example of a method of this kind is described in EP 1946910 A2. There, a plurality of projection devices are combined by a logic composite so as to obtain a larger exposure region. This exposure region has linear overlaps, or what are known as 'seams', at the edges of the individual images butting against one another. In addition, the use of what are known as 'grey scales', i.e. regions in the order of ½ to 1 pixel, is described in EP 1946910 A2, in which the intensity does not correspond to the entire intensity necessary for complete development of a layer. The total layer information is thus divided into individual regions by defining boundary lines, which are then developed via the corresponding radiation source, wherein the edges of the region are fully superimposed with the aid of the grey scales.

EP 1666235 A1 describes a continuous exposure method in which layer information that is greater than an individual exposure surface of the pixel-based mask is at a given resolution, and the associated exposure process is performed by projecting a video synchronised with a movement device. A region that is narrow, although in theory it can be of unlimited length, can thus be cured in a selective position. The expansion in the direction transverse to the movement direction can thus also be increased arbitrarily by line-by-line scanning. This results in turn in overlap regions in which double exposure is achieved by modulation of the irradiation intensity so as to provide a composite of the strips arranged adjacent to one another.

The known methods have some disadvantages. Boundary lines or even gaps are often formed at the boundaries between the sub-regions and are produced in separate development steps and can cause the produced object to break. In addition, material-dependent ageing effects, in particular with use of grey scales in the overlap region of the individual images, lead to incomplete curing. In addition, the linear overlap regions of the sub-layer information lead to a non-uniform strength of the produced object and can additionally be detrimental to the appearance.

The objective of the present invention is to avoid the aforementioned disadvantages of the known stereolithographic methods with layers composed of sub-regions. In particular, defects and predetermined breaking points in the overlap regions of the individual images as a result of incomplete development are to be avoided, and the effects of the linear overlaps are to be eliminated, so as to achieve a greater strength with an improved three-dimensional composite. In particular, errors in the exposure process caused by incorrectly formed boundary lines, which can cause the object to break, are to be avoided.

The stated problem, proceeding from a method of the kind described in the introduction, is solved in that, in accordance with the invention, at least one of the sub-regions in an edge area adjoining another sub-region of the same layer contains area parts which protrude into the other sub-region in a form-fitting manner, for example in a comb-like and/or hook-like and/or dovetail-like manner.

This solution constitutes a new approach for joining together image information in sub-regions to form overall layer information, proceeding from a division of the original overall layer information into individual sub-regions. Instead of a straight or only slightly curved separation line between the sub-regions, the boundary region between sub-regions is formed such that the sub-regions engage in one another and enter into a form-fitting connection of the sub-regions to one another; the sum of the sub-regions then gives, on the whole, the layer or the layer information of this layer.

Here, "form-fitting connection" means that at least one of the sub-areas is connected to the associated sub-region and the width of the connecting area does not increase in the direction of the associated sub-region; it can be particularly favourable here if the sub-area is connected to the associated sub-region by means of a connecting area of smaller or even decreasing width, as is the case for example in a dovetail-like connection, or in the case of a connection via a "throat-like" portion having a smaller width than the main part of the sub-area. In the case of a form-fitting connection, it is not possible to release the connected parts from one another without the parts being deformed or even destroyed, for example by removing one or more of the area parts that protrude into another sub-region. The strength of the component in the sub-region is also increased compared to other approaches, since cracks can propagate only with difficulty on account of the engagement of the sub-regions in one another. These sub-regions are developed in succession and thus, as a whole, form the desired layer regions, which in turn as a whole form the three-dimensional object to be produced.

In an advantageous aspect of the invention it can be provided that edge areas of sub-regions that are adjacent to one another in a layer are contiguous; here, they can engage in one another in a comb-like and/or form-fitting manner. In accordance with a favourable embodiment of this aspect, the edge areas of sub-regions that are adjacent to one another can engage in one another along a dividing line which prevents the edge areas or the sub-regions from separating from one another, such that the form is preserved. In this way, the cohesion within the object between the sub-regions can be significantly improved.

A modification of this aspect extends the design of the contiguous edge areas to a plurality of layers arranged one above the other. Accordingly, it can be provided that a number of layers arranged one above the other are divided into sub-regions corresponding geometrically to one another, wherein the edge areas of mutually corresponding sub-regions of layers arranged one above the other, considered together, form a contiguous three-dimensional form, wherein the three-dimensional forms thus formed engage in one another and prevent separation, such that the form is preserved.

In accordance with an advantageous development of the invention, at least two of the sub-regions which are adjacent to one another in a layer can contain area parts protruding into the other sub-region in a form-fitting manner.

One embodiment of the invention can provide an overlap area between two sub-regions of a layer adjacent to one another, wherein the edge areas contain area parts protruding in a form-fitting manner into the other sub-region; here, in each overlap area the development of the layer occurs partially in those development steps that belong to the sub-regions involved in the overlap area. The two sub-regions involved in the overlap area are preferably formed in a manner complementary to one another with respect to the layer or layer information to be produced. In this embodiment the division in the overlap area for example can be such that the overlap area is divided into area pieces in a mosaic-like manner, and the area pieces thus formed are assigned randomly to the sub-regions involved in the overlap area. As a result of this random distribution, a reliable and stable transition is provided, which at the same time avoids the forming of a pattern by regular structures. In order to achieve mutual engagement of the sub-regions by means of members that are as fine as possible, it can be favourable if the mosaic-like division is provided in conformity with a division of the layer into pixels or predetermined groups of pixels.

The layers can be developed generally by exposure to a radiation triggering a curing of the layer. A radiation of this kind, which is suitable for triggering the curing of the substance, is also referred to here as actinic radiation.

Generally, the development process is configured such that the sub-regions are exposed in a chronological sequence, the sub-regions of each layer preferably being exposed in direct chronological succession.

In addition, in layers arranged one above the other, the layers can be divided into sub-regions in such a way that the edge areas of the different layers (for example successive layers) have geometries mirroring one another and/or have inverted geometries.

In order to avoid compromising the shaping of the body to be produced with regard to the outer contour thereof, it can be favourable if the area parts that protrude into another sub-region in a form-fitting manner are distanced from the outer contour of the three-dimensional object to be produced, preferably by a predefined minimum distance.

In a development of the invention all layers or individual layers can be developed in a plurality of (i.e. two or more) exposure passes, wherein the exposure passes of a layer are performed in a chronological sequence and in each case substantially for the entire layer. In this case, the invention can be embodied such that, in at least one of the exposure passes, the layer in question is divided into at least two sub-regions which are arranged substantially adjacent to one another and are each developed in separate development steps, wherein at least one of these sub-regions, in an edge area adjoining another sub-region of the same layer in the same exposure pass, contains area parts that protrude into the other sub-region in a form-fitting manner.

Within the scope of the invention, the exposure, and therefore also the production of the layer information, can also be performed continuously. For example, this can be achieved by a relative movement between exposure surface and light source, wherein for example a mask exposure system (for example DMD, DLP) is used, the exposure pattern produced thereby changing continuously depending on the position of the exposure surface or the light surface in accordance with the position and the corresponding relative speed, and thus constituting a continuous projection.

The invention and further embodiments and preferred features will be described in greater detail hereinafter with reference to a non-limiting exemplary embodiment depicted in the accompanying drawings. The drawings show, schematically:

FIG. 1 the structure of a three-dimensional object from a plurality of layers, which are each divided into sub-regions;

FIG. 2a-2e illustrate the division of a layer into two sub-regions, wherein FIG. 2a shows a layer with the layer information for a three-dimensional object, FIG. 2b shows the division of the layer into two sub-regions, FIG. 2c shows the determination of an overlap region, and FIGS. 2d and 2e show the division of the overlap area with boundary regions engaged in a comb-like and/or hook-like manner;

Figure 1:
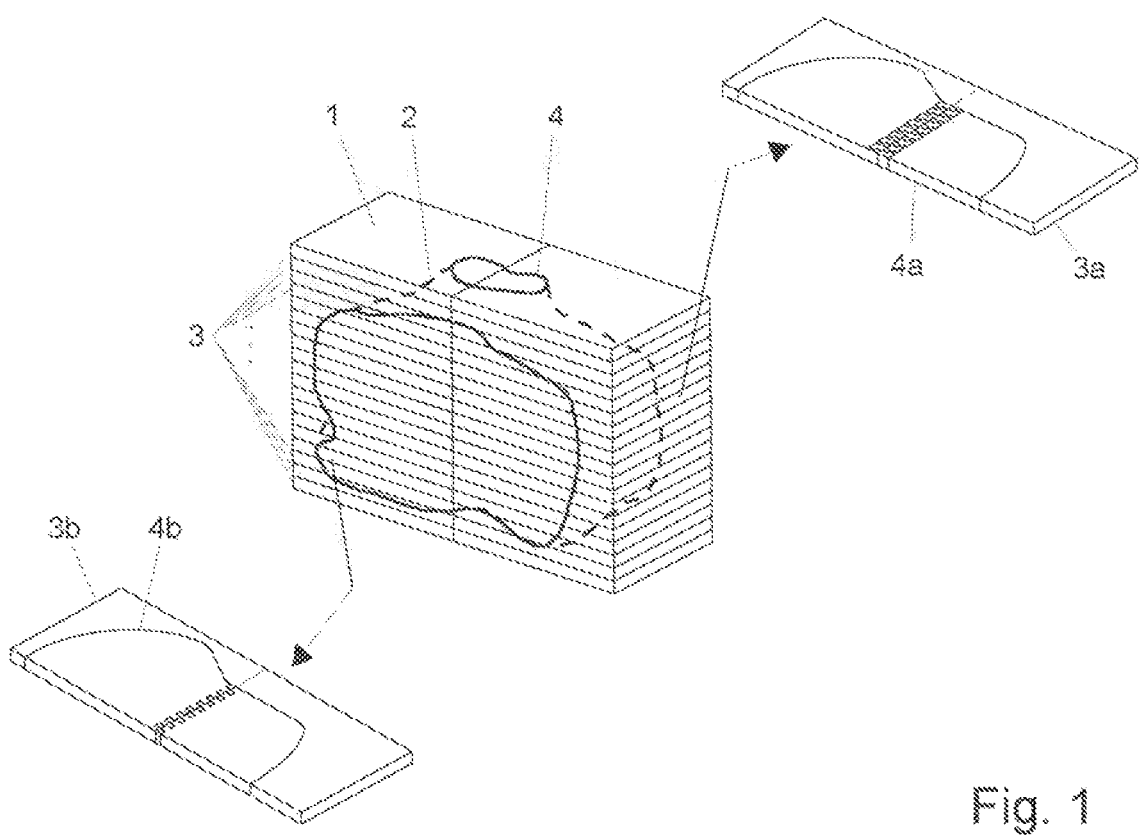

The perspective view of FIG. 1 shows a spatial region 1 in which a three-dimensional body 2 is produced by means of a stereolithographic method. In accordance with a conventional procedure, the spatial region 1 is divided into a plurality of layers 3 arranged one above the other; the layers 3 preferably have a uniform thickness. The three-dimensional body 2 is formed in the spatial region 1 from multiple layers of layer information 4, arranged one above the other. Here, layer information denotes those regions within a layer that are to be developed in accordance with the body 2 to be produced. Reference sign 4 denotes the layer information of the uppermost layer by way of example. FIG. 1 also shows, in an exemplary manner, two of the layers 3a, 3b with the layer information 4a, 4b contained therein respectively. The layer information 4, 4*a*, 4*b* is developed in chronological sequence, for example starting with the uppermost layer and moving downwardly (vice versa in other variants as appropriate), whereby the body 2 is produced layer by layer. The form of the body 2 can be selected arbitrarily. The body 2 is held by a holder (not shown), to which the body is connected via the first produced layer information 4 (i.e. the uppermost layer in this case) and generally remains connected during the production process. The body 2, apart from this holding point at the first produced layer, is usually disposed completely within the overall region 1. However, the body 2 can additionally bear against one or more side faces of the spatial region 1; for example, as shown in the present exemplary embodiment, the body 2 can bear against the front side of the overall region 1.

In accordance with the invention the light-sensitive material is developed in a layer in at least two chronologically separate development steps, which each develop a sub-region of the layer. For this purpose, the layer is divided into two or more sub-regions, which are substantially adjacent to one another within the layer, wherein a sub-region, in an edge area adjoining another sub-region of the same layer, contains area parts that protrude into the other sub-region in a form-fitting manner. These sub-regions are developed in succession and therefore the desired layer regions, as a whole, form a layer in each case. The sub-regions of all layers as a whole thus give the overall three-dimensional body.

The layers 3, 3*a*, 3*b* are shown in FIG. 1 already with a division into sub-regions according to the invention. In the shown embodiment the division of the layers is substantially uniform, however the division can also vary from layer to layer within the scope of the invention.

Figure 2A:
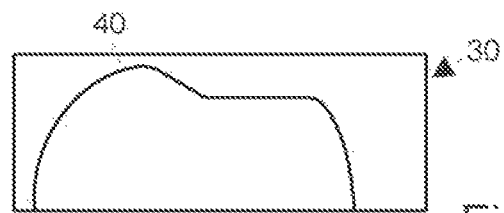
Figure 2B:
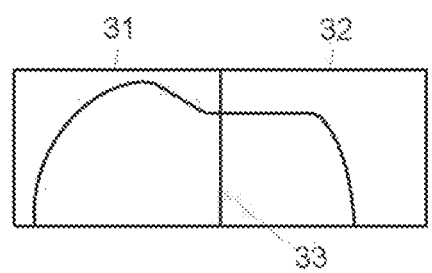
Figure 2C:
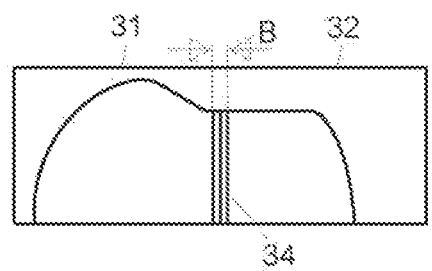
Figure 2E:
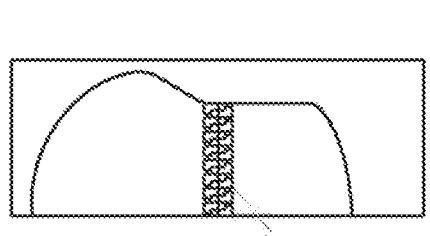
Figure 2D:
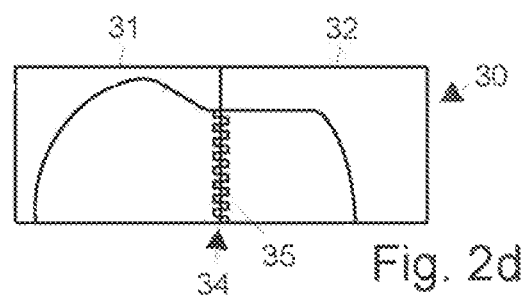

The division of a layer into two sub-regions is illustrated in FIGS. 2*a* to 2*e*. FIG. 2*a* shows an exemplary layer 30 with the layer information 40 of a three-dimensional object. The layer 30—for example because it is too large for an individual exposure process, or for other reasons—is divided into two sub-regions 31, 32, which for example lie one on either side of a dividing line 33, as shown in FIG. 2*b*. The dividing line 33 shown here is straight, but in other embodiments can also be curved or can be composed of straight or curved line parts. An overlap area (or transition region) 34 is then defined (FIG. 2*c*) and extends along the dividing line, for example with a width B which in the shown exemplary embodiment is constant along the dividing line. The width of the overlap area, however, can also vary along the course of the dividing line, in particular if the dividing line is curved or is composed of pieces having different orientations. The overlap area is then divided again over the two sub-regions, wherein area parts that belong to one sub-region protrude between area parts belonging to the other. In this way, a form-fitting connection of the two sub-regions 31, 32 is produced. As just some examples of many possibilities, FIG. 2*d* shows a division of the overlap area 35 with boundary regions engaged in a comb-like manner, and FIG. 2*e* shows an overlap area 36 with area parts engaging in one another in a hook-like manner.

The division can be provided for example in that the overlap area is segmented into area parts arranged in succession along the dividing line, and these area parts are allocated alternately to the adjacent sub-regions. The area parts for example can be strips or rectangles oriented in parallel, potentially resulting in a comb-like division, as shown in FIG. 2*d*. In addition, the area parts can form protrusions or meander patterns, whereby the areas hook into one another. In all of these cases there is an engagement with area parts that protrude in a form-fitting manner into the other sub-region, wherein the edge areas of sub-regions adjoining one another within a layer are preferably contiguous in each case. As can also be seen on the basis of the examples of FIGS. 2*d* and 2*e*, the dividing line is replaced in the overlap area 34 by a complex dividing line, along which the edge areas of the adjoining sub-regions engage in one another. In this way, a close connection of the two sub-regions is ensured; in particular, it is not possible for the edge areas to be separated from one another without the object being deformed or broken in or next to the overlap area.

In accordance with the invention the image information formed in the sub-regions can vary from layer to layer, not only in respect of its physical position and extent, but also in respect of the formed geometry. This means for example that a pattern formed in the sub-regions or overlap areas differs from the pattern of the previous layer and/or the next layer to be produced, in this region.

For example, in the simplest case, a mirroring and/or inversion of the geometric information of the pattern in the overlap area of the previous layer can be formed in the overlap area or part thereof, for example. The mirroring can be provided for example at the dividing line or a middle line of the overlap area, or at a line perpendicular thereto; a point-based mirroring (for example at a centre point of the area in question) can also be provided. "Inversion" means the reversal of the allocation of the area parts to the two sub-regions involved; or in other words, expressed in grey scales, inversion means the replacement of a grey scale value x by the value 1−x. The mirrored and/or inverted pattern or the inverted form of the form-fitting pattern is thus used in successive overlap areas of different layers. This simplifies the calculation of the pattern in the overlap area.

The overlap area can also be divided into area pieces in a mosaic-like manner, and the mosaic-like area pieces are then allocated to the relevant sub-regions on the basis of a previously defined method, or randomly (for example by means of a pseudorandom number generator). In a particularly simple, but nevertheless effective special case, the mosaic-like division is provided in accordance with the pixels (or predetermined groups of pixels, for example with pixel areas of, in each case, n×m pixels, wherein n and m are positive integers, n=m>1 is also possible), which are modelled on a raster-based development of the layer.

Figure 3:
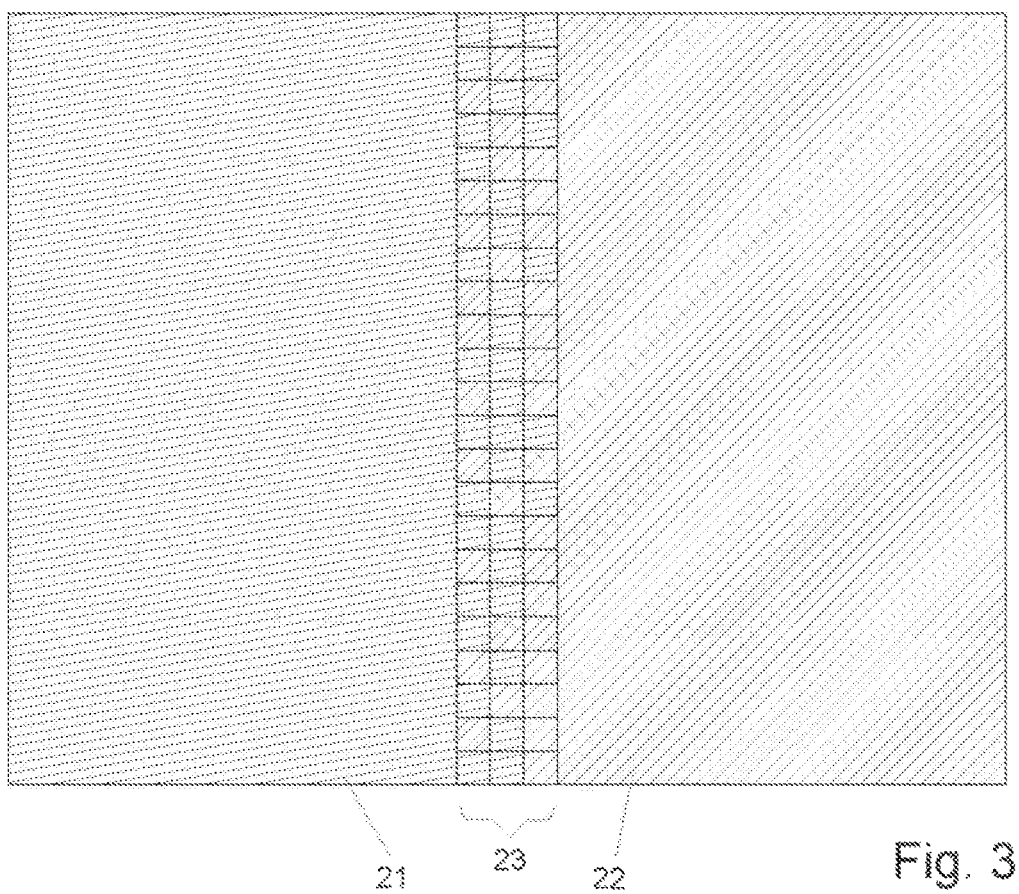
FIG. 3 illustrates an embodiment with a division of pixels of an overlap area in accordance with a random allocation to the two sub-regions.

FIG. 3 illustrates an example of a division of an overlap area 23 with a width of 3 pixels. The pixels of the overlap area are allocated irregularly ("randomly") to one sub-region 21 or the other sub-region 22, which is indicated in the figure by the corresponding hatching.

The method according to the invention can also be combined with exposure in accordance with grey scales. Here, the allocation of the sub-areas or pixels (or pixel groups) in the overlap area is not provided directly to the two sub-regions, but to grey scale values, which can assume values between 0 and 1, or accordingly values between 0% and 100%. Grey scale values are known for exposure in overlap regions in the case of stereolithographic processes. Here, the exposure dose necessary for development for an area is supplied in part in each of the two development steps for the two sub-regions in question, such that, on the whole, the necessary exposure dose is achieved, for example 50% in each step, or 40% and 60% (corresponding to a grey scale x=0.4=40%). In the case of the limit values, a grey scale value x=100% means that the exposure occurs entirely in the exposure step of the first sub-region, whereas x=0% means that the exposure occurs (only) in the exposure step of the second sub-region.

The width B and the location of the overlap area can remain the same or can vary from layer to layer. For example, an overlap strip in layer n could be formed of B=5 pixel rows, of 4 pixel rows in the previous layer n−1, and of 8 pixel rows in the subsequent layer n+1; these numbers are of course merely exemplary. The extent of the overlap areas or the sub-areas formed therein can thus change from layer to layer.

Figure 4:
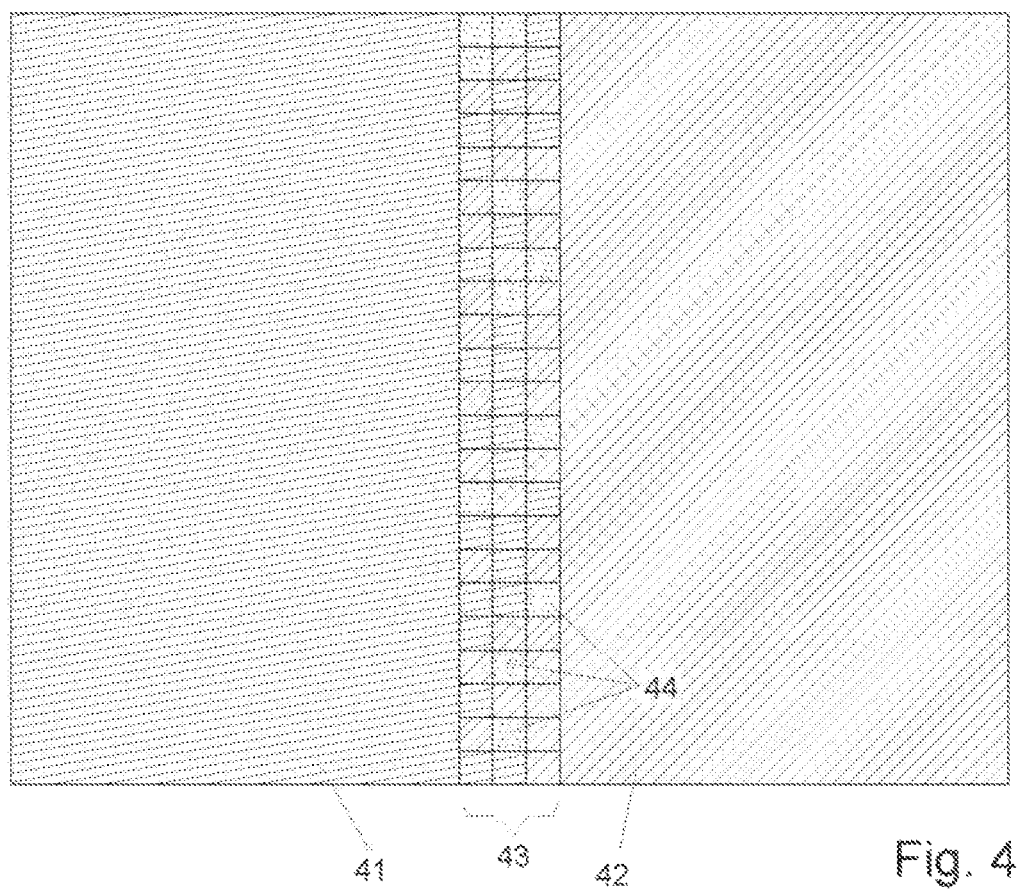
FIG. 4 illustrates an embodiment with a division of pixels of an overlap area in accordance with a random allocation and grey scales.

FIG. 4 illustrates a variant of the division of FIG. 3 with grey scales. Again, the allocations of the pixels in the overlap area 43 to the sub-regions 41 and 42 (=grey scales 100% and 0%) are symbolised by the hatching. The pixels 44 illustrated by dots have a grey scale. For example, the value of the grey scale is 50%, i.e. the pixels are exposed by half the necessary exposure dose in each of the two exposure steps for the two sub-regions 41 and 42. In other variants the grey scales can be selected differently. For example, the grey scales can assume the values 30% and 70% in alternation or in a randomly distributed manner. Of course, other grey scale values and a larger number of grey scale values can also be used depending on the desired application.

Figure 5:
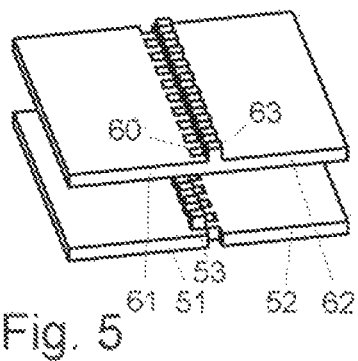
FIG. 5 shows an embodiment of the invention in which layers arranged one above the other are engaged in one another.
Figure 6:
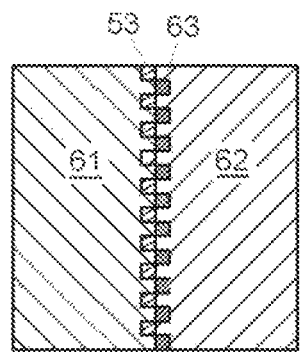
FIG. 6 shows a plan view of a layer of FIG. 5.

A further variant is illustrated in FIGS. 5 and 6. When a pixel (or area part) is fed an exposure dose of more than 100%, this leads to a layer region that has a greater thickness than the rest of the layer. In this way, pins or teeth protruding into the layer arranged above can be formed.

For example, in FIG. 5 the sub-region 51 has teeth 53 at the boundary to the sub-region 52, which teeth can be produced for example by exposure with 200% of the "normal" exposure dose in the main area of the sub-region. These teeth 53 protrude into openings 60 in the sub-region 61 of the layer arranged above. These openings correspond to an exposure with 0%. The other region 62 of the upper layer in turn has teeth which can engage in a third layer (not shown), and so on. FIG. 6 shows a plan view of the upper (second) layer of FIG. 5, wherein the upwardly protruding teeth 53 of the layer arranged below can be seen along the dividing line between the sub-regions 61 and 62.

This aspect of the invention makes it possible for the geometry information of the layers and sub-regions thereof to be modified such that they contribute, as a whole, to an engagement of the layers of the formed object, whereas the forming of a single linear seam, which could facilitate the development of a break or separation, is avoided In accordance with the invention, layer information is produced by the sum of the sub-regions formed by at least partial overlapping of at least two adjacent sub-regions, which layer information again is in conformity geometrically with the desired layer geometry of the object to be formed. Within the scope of the invention a sub-area in the overlap area of a sub-region, at least as a whole, constitutes part of the exposure surface of the layer to be produced. The exposure process can have different exposure times, sequences and intensities between the sub-area and the sub-region to which it belongs.

Generally, a plurality of layers arranged one above the other can be divided into sub-regions (preferably, but not necessarily corresponding to one another geometrically), and these sub-regions engage in one another in a form-fitting manner. Here, the edge areas of mutually corresponding sub-regions of layers arranged one above the other, considered together, additionally form a contiguous three-dimensional form, such that the three-dimensional forms thus formed engage in one another and prevent separation, such that the form is preserved.

Of course, the invention is not limited to the presented exemplary embodiments, but includes all embodiments according to the claims. In accordance with the invention the overlap region is divided into "sectors" (i.e. sub-areas), which extend beyond the original boundary line, which constitutes the dividing line between adjacent sub-regions, and in this regard no longer correspond to the original geometric information. Only by overlapping the sectors of the sub-regions in question is the original geometric information of the layer region reproduced.

By combining the corresponding sectors of the sub-regions, the complete layer information of the particular layer is restored, for example in that the corresponding sectors act in a supplementary manner relative to one another in respect of their geometric information, i.e. are complementary to one another. This can also be provided in combination with the above-described grey scales, for example with grey scales of values x and 1−x. Instead of grey scales, a pulse width modulation (PWM) in the case of pixel-based exposure systems can also be achieved.

It can additionally be advantageous if the sub-areas (i.e. "sectors") formed in the overlap areas take into consideration the original geometry of the layer information of the sub-regions, in particular the contours corresponding to the surface of the three-dimensional body to be produced; for example a sector can contain part of the contour of the geometry of the sub-region, i.e. the dividing line. Since, when producing the body, at least the outer contour thereof is to be maintained or accurately portrayed, it can be favourable if a complex division according to the invention (for example by a mosaic or an engagement as described above) is implemented only from a certain minimum distance from the outer contour (for example 2 pixels). For example, in this case a pseudorandom generator would start to divide these sub-areas or pixels in an overlap area in accordance with the invention only at a distance from the outer surface of the body; the (minimum) distance can be specified for example in accordance with an offset defined in pixels or absolute units (for example millimetres).

In addition, a sector can also be exposed multiple times, specifically in further exposure steps additionally to those two that belong to the two sub-regions, and in different chronological sequences and intensities. In particular, a layer can be exposed in a plurality (k>1) of passes, which each deliver part of the exposure (for example with exposure intensity=1/k of the desired end intensity); another division of the layer into sub-regions can be provided in each pass, such that the overlap area of the passes is different in each case. An area piece in a pass can thus correspond to a sector of an overlap area, wherein this sector can be exposed once with an intensity corresponding to one of the relevant sub-regions of the particular pass; in the other passes, the area piece can lie in the middle of a sub-region, such that in these passes the exposure is implemented with an intensity in accordance with the particular sub-region. In a variant, the intensity values of the various passes can additionally be varied for a specific area piece, such that the total sum of the intensities remains the same, specifically the desired exposure intensity. This can additionally improve the inner cohesion of the sub-regions and sectors within a layer, and also of the layers among one another.

The invention claimed is:

1. A method for producing a three-dimensional object (2) in a stereolithographic process, the method comprising:

developing a plurality of layers (3) in a chronological sequence such that, as a whole, they form the three-dimensional object, wherein the layers are developed by exposure to a radiation to trigger a curing of the layers, and wherein at least one of the layers (3, 3a, 3b, 30) is divided into at least two sub-regions wherein each sub-region lies substantially on either side of a dividing line, and which lie substantially adjacent to one another and are developed using pixel-based mask exposure in chronologically separate development steps, and wherein an overlap area is provided extending along the dividing line, wherein the overlap area includes edge areas of the adjacent at least two sub-regions which protrude into each other in a form-fitting manner to prevent the edge areas from separating from one another, and wherein the developing of the overlap area occurs partially in the developing step that belongs to the at least two sub-regions whose edge areas are included in the overlap area; and wherein edge areas of sub-regions that are adjacent to one another in a layer are contiguous and engage in one another in a comb and/or hook and/or dovetail manner.

2. The method according to claim 1, wherein a number of layers arranged one above the other are divided into sub-regions (51, 52, 61, 62) corresponding geometrically to one another, wherein the edge areas of mutually corresponding sub-regions of layers arranged one above the other, considered together, form a contiguous three-dimensional form.

3. The method according to claim 1, wherein the division in the overlap area (23, 43) is such that the overlap area is divided into area pieces in a mosaic-like manner, and the area pieces thus formed are assigned randomly to the sub-regions involved in the overlap area.

4. The method according to claim 3, wherein the mosaic-like division is provided in conformity with a division of the layer into pixels or predetermined groups of pixels.

5. The method according to claim 1, wherein the sub-regions are exposed in a chronological sequence.

6. The method according to claim 1, wherein, in layers arranged one above the other, each layer is divided into sub-regions, wherein the edge areas in different layers have geometries mirroring one another and/or have inverted geometries.

7. The method according to claim 1, wherein the three-dimensional object (2) comprises an outer contour and wherein area parts (35, 36, 53, 63) that protrude in a form-fitting manner into another sub-region are distanced from the outer contour of the three-dimensional object (2) to be produced, and specifically are distanced by a predefined minimum distance.

8. The method according to claim 5, wherein the sub-regions of each layer are exposed in direct chronological succession.

9. A method for producing a three-dimensional object (2) in a stereolithographic process, the method comprising:
developing a plurality of layers (3) in a chronological sequence such that, as a whole, they form the three-dimensional object, wherein the layers are developed by exposure to a radiation to trigger a curing of the layers, and wherein at least one of the layers (3, 3a, 3b, 30) is divided into at least two sub-regions wherein each sub-region lies substantially on either side of a dividing line, and which lie substantially adjacent to one another and are developed using pixel-based mask exposure in chronologically separate development steps, and wherein an overlap area is provided extending along the dividing line, wherein the overlap area includes edge areas of the adjacent at least two sub-regions which protrude into each other in a form-fitting manner to prevent the edge areas from separating from one another, wherein the overlap area is developed completely, and wherein the developing of the overlap area occurs partially in the developing step that belongs to the at least two sub-regions whose edge areas are included in the overlap area; and wherein edge areas of sub-regions that are adjacent to one another in a layer are contiguous and engage in one another in a comb and/or hook and/or dovetail manner.

10. The method according to claim 9, wherein a number of layers arranged one above the other are divided into sub-regions (51, 52, 61, 62) corresponding geometrically to one another, wherein the edge areas of mutually corresponding sub-regions of layers arranged one above the other, considered together, form a contiguous three-dimensional form.

11. The method according to claim 9, wherein the division in the overlap area (23, 43) is such that the overlap area is divided into area pieces in a mosaic-like manner, and the area pieces thus formed are assigned randomly to the sub-regions involved in the overlap area.

12. The method according to claim 11, wherein the mosaic-like division is provided in conformity with a division of the layer into pixels or predetermined groups of pixels.

13. The method according to claim 9, wherein, in layers arranged one above the other, each layer is divided into sub-regions, wherein the edge areas in different layers have geometries mirroring one another and/or have inverted geometries.

* * * * *